United States Patent
Wiktor et al.

(10) Patent No.: US 9,306,548 B1
(45) Date of Patent: Apr. 5, 2016

(54) PULSE GENERATOR HAVING A PHASE AND VOLTAGE VARYING PULSE WIDTH

(71) Applicant: Texas Instruments Incorporated, Dallas, TX (US)

(72) Inventors: Stefan Wlodzimierz Wiktor, Raleigh, NC (US); Brian Thomas Lynch, Brookline, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/580,314

(22) Filed: Dec. 23, 2014

(51) Int. Cl.
  *H03L 7/00* (2006.01)
  *H03K 3/017* (2006.01)
  *H03K 3/353* (2006.01)

(52) U.S. Cl.
  CPC .................. *H03K 3/017* (2013.01); *H03K 3/353* (2013.01)

(58) Field of Classification Search
  USPC .......... 327/105–123, 141, 144–163; 331/1 A, 331/15–17; 375/373–376
  See application file for complete search history.

(56) References Cited

U.S. PATENT DOCUMENTS

| 6,927,639 B2 * | 8/2005 | Chen ..................... H03L 7/0996 327/119 |
| 2009/0167379 A1 * | 7/2009 | Mobin .................. H03L 7/0812 327/149 |
| 2013/0169329 A1 * | 7/2013 | Searles ..................... H03L 7/10 327/157 |

* cited by examiner

*Primary Examiner* — Brandon S Cole
(74) *Attorney, Agent, or Firm* — John R. Pessetto; Frank D. Cimino

(57) ABSTRACT

A pulse generator generates a square-wave pulsed signal that has a variable pulse width. The pulse width, which is defined by the delay through a delay line, varies in response to variations in an input voltage, as well as in response to phase differences between a reference clock signal and a trigger signal.

20 Claims, 1 Drawing Sheet

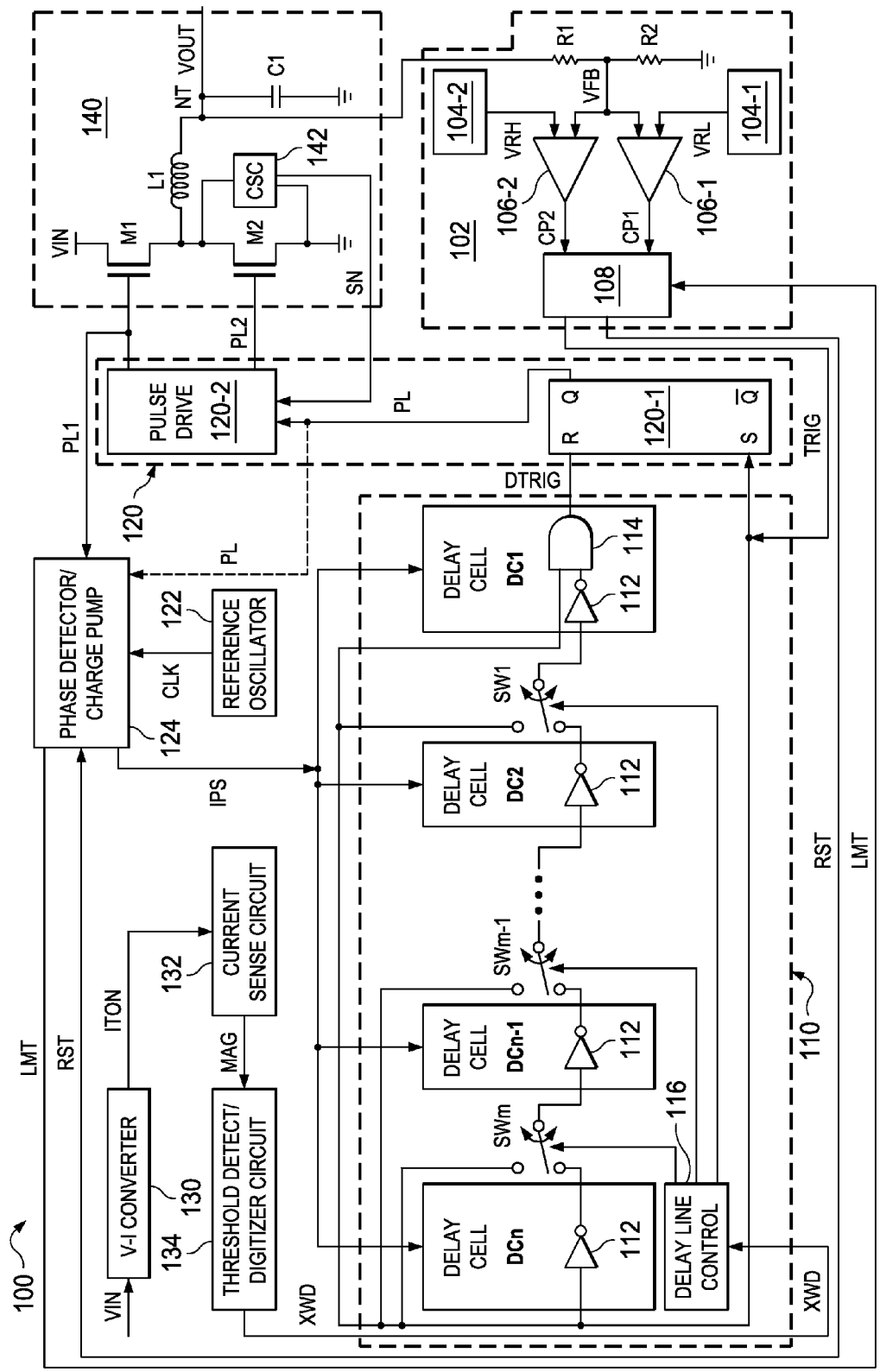

PULSE GENERATOR HAVING A PHASE AND VOLTAGE VARYING PULSE WIDTH

BACKGROUND OF THE INVENTION

1. Field of the Invention

The present invention relates to pulse generators and, more particularly, to a pulse generator that has a phase and voltage varying pulse width.

2. Description of the Related Art

A pulse generator is an electronic circuit that generates a signal which has a series of square-shaped pulses that are separated by a substantially constant lower voltage, such as ground. Each pulse has a pulse width that is defined by the time between the rising and falling edges of the pulse, and a pulse period that is defined by the time between the rising (or falling) edges of two sequential pulses.

One type of pulse generator, such as a clock circuit, produces a pulsed signal that has a substantially constant pulse width and period regardless of any external conditions. By contrast, another type of pulse generator can produce a pulsed signal with a substantially constant pulse width, but with a pulse period that varies in response to changes in an external condition.

For example, a pulse generator can generate a pulsed signal with a substantially constant pulse width by using a trigger signal to set a SR flip-flop and discharge a capacitor, and a comparator output signal to reset the SR flip-flop when the capacitor charges up to a voltage that trips the comparator.

The SR flip-flop generates a rising edge when set, and a falling edge when reset. Thus, the duration of the pulse width is defined by the time required to charge up the capacitor, which remains constant. The period, however, is defined by the trigger signal, which can vary in response to changes in the external condition.

One drawback to a pulse generator that generates a constant pulse width with an SR flip-flop, a capacitor, and a comparator is that it is difficult to generate very short pulse widths, such as pulse widths that are a few nanoseconds wide.

SUMMARY OF THE INVENTION

The present invention is a pulse generator that generates a pulse signal that has a varying pulse width. The pulse generator includes a delay line that receives a trigger signal, generates a delayed trigger signal a delay time later in response to the trigger signal, and varies the delay time in response to changes in a magnitude of a phase shift current. The pulse generator also includes a pulse circuit that is connected to the delay line. The pulse circuit generates a pulsed signal in response to the trigger signal and the delayed trigger signal. The pulse generator further includes an oscillator and a phase detector/charge pump circuit. The oscillator generates a reference clock signal. The phase detector/charge pump is connected to the delay line, the pulse circuit, and the oscillator. The phase detector/charge pump generates the phase shift current, detects a difference in phase between an edge of the reference clock signal and an edge of the pulsed signal, and varies the magnitude of the phase shift current in response to the difference in phase.

The present invention also includes a method of operating a pulse generator. The method includes delaying a trigger signal by a delay time to form a delayed trigger signal, and varying the delay time in response to changes in a magnitude of a phase shift current. The method also includes generating a pulsed signal in response to the trigger signal and the delayed trigger signal. The method further includes generating a reference clock signal, and comparing an edge of the pulsed signal with an edge of the reference clock signal to determine a phase difference. In addition, the method includes generating the phase shift current, and varying the magnitude of the phase shift current in response to the phase difference.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

The FIGURE is a block-schematic diagram illustrating an example of a pulse generator 100 in accordance with the present invention.

DETAILED DESCRIPTION OF THE INVENTION

The FIGURE shows a block diagram that illustrates an example of a pulse generator 100 in accordance with the present invention. As described in greater detail below, pulse generator 100 generates a square-wave pulsed signal that has a variable pulse width. The pulse width varies in response to variations in an input voltage, as well as in response to phase differences between a reference clock signal and a trigger signal.

As shown in the FIGURE, pulse generator 100 includes a regulation circuit 102 that receives an output voltage VOUT, generates a trigger signal TRIG, and varies a frequency of the trigger signal TRIG in response to changes in the output voltage VOUT. Regulation circuit 102 has a number of modes that include an integrating averaging feedback mode and a peak-to-peak monitoring mode.

In the integrating averaging feedback mode, regulation circuit 102 generates the trigger signal TRIG in response to the average plus peak value of the output voltage VOUT falling below a regulation voltage. In addition, regulation circuit 102 receives a limit signal LMT, and switches from the integrating averaging feedback mode to the peak-to-peak monitoring mode in response to the limit signal LMT.

When in the peak-to-peak monitoring mode, regulation circuit 102 monitors the output voltage VOUT, and generates a reset signal RST and switches from the peak-to-peak monitoring mode to the integrating averaging feedback mode when the output voltage VOUT falls below the regulation voltage. Upon entering the integrating averaging feedback mode from the peak-to-peak monitoring mode, regulation circuit 102 generates a burst of trigger signals TRIG until the output voltage VOUT exceeds an overshoot voltage.

In the present example, regulation circuit 102 includes a pair of resistors R1 and R2 that are connected in series as a voltage divider to generate a feedback voltage VFB in response to the output voltage VOUT. The feedback voltage VFB is a fractional value of the output voltage VOUT. Regulation circuit 102 also includes a reference voltage source 104-1 that generates a reference voltage VRL that represents the regulation voltage, and a reference voltage source 104-2 that generates a reference voltage VRH that represents the overshoot voltage.

In addition, regulation circuit 102 includes an amplifier 106-1 and an amplifier 106-2. Amplifier 106-1, which is connected to the resistors R1 and R2 and reference voltage source 104-1, compares the feedback voltage VFB to the reference voltage VRL, and outputs a comparison signal CP1 that changes as the feedback voltage VFB rises above and falls below the reference voltage VRL.

Amplifier 106-2, which is connected to the resistors R1 and R2 and reference voltage source 104-2, compares the feedback voltage VFB to the reference voltage VRH, and outputs a comparison signal CP2 that changes as the feedback voltage VFB rises above and falls below the reference voltage VRH.

Further, regulation circuit 102 includes a trigger signal generator 108 that is connected to the amplifiers 106-1 and 106-2 to receive the comparison signals CP1 and CP2. When in the integrating averaging feedback mode, trigger signal generator 108 generates the trigger signal TRIG in response to the average plus peak value of the feedback voltage VFB (which represents the output voltage VOUT) falling below the reference voltage VRL (which represents the regulation voltage). Trigger signal generator 108 can include conventional proportional integration differentiation (PID) circuitry.

Further, when in the peak-to-peak monitoring mode in response to the limit signal LMT, trigger signal generator 108 generates the reset signal RST and switches from the peak-to-peak monitoring mode to the integrating averaging feedback mode when the comparison signal CP1 indicates that the feedback voltage VFB has fallen below the reference voltage VRL.

Upon entering the integrating averaging feedback mode from the peak-to-peak monitoring mode, trigger signal generator 108 generates a burst of trigger signals TRIG until the comparison signal CP2 indicates that the feedback voltage VFB has exceeded the reference voltage VRH. In addition, the comparison signal CP2 can indicate that the feedback voltage VFB has exceeded the reference voltage VRH after one trigger signal TRIG. As a result, the burst of trigger signals TRIG can include only one trigger signal TRIG.

As further shown in the FIGURE, pulse generator 100 includes a delay line 110 that receives the trigger signal TRIG, and generates a delayed trigger signal DTRIG a delay time later in response to the trigger signal TRIG. In addition, delay line 110 also receives a phase shift current IPS, and varies the delay time in response to changes in the magnitude of the phase shift current IPS. Further, delay line 110 receives an x-bit control word XWD, and varies the delay time in response to changes in the x-bit control word XWD. Delay line 110 can be implemented in a number of ways.

In the present example, delay line 110 includes a series of delay cells DC1-DCn. Each delay cell DC, in turn, generates an output edge a propagation time after receiving an input edge. The delay cells DC1-DCn can be implemented in a number of ways. In the present example, each delay cell DC is implemented with an inverter 112, while delay cell DC1 also includes an AND gate 114. AND gate 114 has a first input that is connected to the input of the inverter 112 within delay cell DC1, and a second input that is connected to the output of the inverter 112 within delay cell DC1.

Delay line 110 also includes a series of switches SW1-SWm that are connected to and between each adjacent pair of delay cells DC1-DCn, and a delay line controller 116 that is connected to the switches SW1-SWm. Delay line controller 116 closes a number of switches SW in response to the x-bit control word XWD to set the length of delay line 110 and, thereby, set the delay time.

The x-bit control word XWD identifies a number of delay cells DC from the series of delay cells DC1-DCn, and the switches SW connect together the number of delay cells DC that are identified by the x-bit control word XWD. Delay cell DC1 generates the delayed trigger signal DTRIG the delay time after delay line 110 receives the trigger signal TRIG.

The delay time is substantially equal to the sum of the propagation times for the number of delay cells DC that have been connected together, along with the cell-to-cell propagation times. In the present example, the x-bit control word XWD is a seven-bit word that can select from one up to 128 delay cells to be connected together.

As additionally shown in the FIGURE, pulse generator 100 also includes a pulse circuit 120 that is connected to (delay cell DC1 of) delay line 110 to receive the delayed trigger signal DTRIG. Pulse circuit 120 generates a pulsed signal PL1 in response to the trigger signal TRIG and the delayed trigger signal DTRIG. The pulsed signal PL1 has a square waveform with pulse widths that are defined by the timing difference between the trigger signal TRIG and the delayed trigger signal DTRIG.

In the present example, pulse circuit 120 includes a SR flip-flop 120-1 and a pulse drive circuit 120-2. SR flip-flop 120-1 has a set input S that receives the trigger signal TRIG, and a reset input R that receives the delayed trigger signal DTRIG from (delay cell DC1 of) delay line 110. SR flip-flop 120-1 additionally has a Q output that outputs a pulsed signal PL. The pulsed signal PL has a square waveform with a rising edge defined by the rising edge of the trigger signal TRIG input to the set input, and a falling edge defined by the rising edge of the delayed trigger signal DTRIG input to the reset input. As a result, the pulse width is defined by the delay time through delay line 110.

Pulse drive circuit 120-2 is connected to the Q output of SR flip-flop 120-1 to receive the pulsed signal PL. Pulse drive circuit 120-2, which provides a drive current, drives the pulsed signal PL out from pulse drive circuit 120-2 as the pulsed signal PL1. As a result, the pulsed signal PL1 also has a square waveform with a rising edge defined by the rising edge of the trigger signal TRIG, and a falling edge defined by the rising edge of the delayed trigger signal DTRIG.

Further, pulse drive circuit 120-2 can also generate and drive a pulsed signal PL2 in response to the pulsed signal PL or the pulsed signal PL1. Except for dead times (short times when both of the pulsed signals PL1 and PL2 are low), the pulsed signal PL2 is the inverse of the pulsed signal PL1.

As also shown in the FIGURE, pulse generator 100 includes an oscillator 122 and a phase detector/charge pump 124 that is connected to pulse circuit 120 and oscillator 122. Oscillator 122 generates a reference clock signal CLK. Phase detector/charge pump 124 generates a phase shift current IPS with a nominal magnitude, detects a difference in phase between the rising edge of the reference clock signal CLK and the rising edge of the pulsed signal PL1, and varies the magnitude of the phase shift current IPS in response to the difference in phase. Phase detector/charge pump 124 increases the phase shift current IPS when the reference clock signal CLK leads the pulsed signal PL1, and decreases the phase shift current IPS when the reference clock signal CLK lags the pulsed signal PL1.

Alternately, as shown by the dashed lines in the FIGURE, phase detector/charge pump 124 can be connected to SR flip-flop 120-1 to receive the pulsed signal PL in lieu of the pulsed signal PL1 when the drive provided by pulse drive circuit 120-2 is not required. The rising edge of the pulsed signal PL differs from the rising edge of the pulsed signal PL1 by the propagation and switching delays through pulse drive circuit 120-2.

In addition, when the phase shift current IPS reaches a maximum magnitude, phase detector/charge pump 124 generates the limit signal LMT, returns the magnitude of the phase shift current IPS to the nominal magnitude, and then stops detecting the phase difference between the reference clock signal CLK and the pulsed signal PL1. Phase detector/charge pump 124 also receives the reset signal RST, and resumes detecting the phase difference between the reference clock signal CLK and the pulsed signal PL1 in response to the reset signal RST.

The phase shift current IPS generated by phase detector/charge pump 124 is input to (the inverters 112 and the AND gate 114 within the delay cells DC1-DCn of) delay line 110 to provide the current and voltage necessary for operation. When the magnitude of the phase shift current IPS increases from the nominal magnitude, (the inverters 112 and the AND gate 114 within the delay cells DC1-DCn of) delay line 110 operates faster and thereby reduces the delay time. When the magnitude of the phase shift current IPS decreases from the nominal magnitude, (the inverters 112 and the AND gate 114 within the delay cells DC1-DCn of) delay line 110 operates slower and thereby increases the delay time.

Further, pulse generator 100 includes a voltage-to-current converter 130 that receives an input voltage VIN, such as a power supply voltage, converts the input voltage VIN into a timing current ITON, and varies the magnitude of the timing current ITON in response to changes in the magnitude of the input voltage VIN.

In addition, pulse generator 100 includes a current sense circuit 132 that is connected to voltage-to-current converter 130, and a threshold detect/digitizer circuit 134 that is connected to current sense circuit 132 and (delay line controller 116 of) delay line 110. Current sense circuit 132 senses the magnitude of the timing current ITON, and outputs a current magnitude signal MAG in response. The magnitude of the current magnitude signal MAG represents the magnitude of the timing current ITON. Threshold detect/digitizer circuit 134, in turn, changes the x-bit control word XWD in response to changes in the magnitude of the current magnitude signal MAG.

Thus, voltage-to-current converter 130 converts the input voltage VIN into a timing current ITON. Current sense circuit 132 senses the magnitude of the timing current ITON, and generates the magnitude signal MAG in response. Threshold detect/digitizer circuit 134 responds to the current magnitude signal MAG, and outputs the x-bit control word XWD with a value that selects a number of delay cells DC that are to be connected together within delay line 110.

In the present example, the input voltage VIN is substantially constant, but can vary over a range of values due to a variety of reasons. When the input voltage VIN increases, the timing current ITON and the current magnitude signal MAG increase. When the current magnitude signal MAG increases, threshold detect/digitizer circuit 134 detects the increase in magnitude and changes the x-bit control word XWD to reduce the number of delay cells DC that are connected together within delay line 110. Reducing the number of delay cells DC that are connected together in delay line 110 reduces the pulse widths of the pulsed signals PL and PL1.

When the input voltage VIN decreases, the timing current ITON and the current magnitude signal MAG decrease. When the current magnitude signal MAG decreases, threshold detect/digitizer circuit 134 detects the decrease in magnitude and changes the x-bit control word XWD to increase the number of delay cells DC that are connected together within delay line 110. Increasing the number of delay cells DC that are connected together in delay line 110 increases the pulse widths of the pulsed signals PL and PL1.

As illustrated in the FIGURE, pulse generator 100 can be utilized in a buck converter circuit 140. In buck converter circuit 140, the pulse width of the pulsed signal PL1 is utilized to control the on-time of a drive MOS transistor M1. When turned on, drive MOS transistor M1 sources a current through an inductor L1 to a capacitor C1 and a load that are connected to an output node NT. The current that flows through inductor L1 creates and temporarily stores energy in a magnetic field around inductor L1, while the current that flows to capacitor C1 charges up the output voltage VOUT on the output node NT via capacitor C1 and provides power to the load.

After drive MOS transistor M1 turns off, a synchronous MOS transistor M2 turns on a short dead time later. The dead time ensures that drive MOS transistor M1 is fully off before synchronous MOS transistor M2 turns on, which prevents shoot-through from occurring where current flows through drive MOS transistor M1 and synchronous MOS transistor M2 directly to ground.

When drive MOS transistor M1 turns off, a current no longer flows through drive MOS transistor M1 to inductor L1 which, in turn, causes the magnetic field around inductor L1 to begin to collapse. The collapsing magnetic field releases the energy stored in the magnetic field and causes a current to flow through the body diode (p-body grounded and n-drain pulled below ground) of synchronous MOS transistor M2 through inductor L1 to capacitor C1.

Current only flows through the body diode for the short dead time. After synchronous MOS transistor M2 turns on, the current flows from the ground-connected source to the drain of synchronous MOS transistor M2 through inductor L1 to capacitor C1 to maintain the output voltage VOUT and continue to provide power to the load. The pulsed signal PL2 controls the on-time of synchronous MOS transistor M2.

In addition, the input voltage VIN is the supply voltage input to the buck converter 140, i.e., the input voltage VIN is connected to the drain of drive MOS transistor M1. As a result, pulse generator 100 responds to changes in the supply voltage input to buck converter 140. One of the advantages of the present invention is that pulse generator 100 responds directly to changes in the supply voltage, and does not rely on changes in the output voltage VOUT or the feedback voltage VFB that result from changes in the supply voltage.

If the supply voltage input to buck converter 140 increases, the input voltage VIN, the timing current ITON, and the current magnitude signal MAG increase. When the current magnitude signal MAG increases, threshold detect/digitizer circuit 134 detects the increase in magnitude and changes the x-bit control word XWD to reduce the number of delay cells DC that are connected together within delay line 110.

Reducing the number of delay cells DC that are connected together in delay line 110 reduces the pulse widths of the pulsed signals PL and PL1. Reducing the pulse widths of the pulsed signals PL and PL1 reduces the time that drive MOS transistor M1 is turned on, which compensates for the increase in the supply voltage input to buck converter 140.

If the supply voltage input to buck converter 140 decreases, the input voltage VIN, the timing current, and the current magnitude signal MAG decrease. When the current magnitude signal MAG decreases, threshold detect/digitizer circuit 134 detects the decrease in magnitude and changes the x-bit control word XWD to increase the number of delay cells DC that are connected together within delay line 110.

Increasing the number of delay cells DC that are connected together in delay line 110 increases the pulse widths of the pulsed signals PL and PL1. Increasing the pulse widths of the pulsed signals PL and PL1 increases the time that drive MOS transistor M1 is turned on, which compensates for the decrease in the voltage input to buck converter 140.

In addition to varying the pulse widths of the pulsed signals PL and PL1 in response to changes in the input voltage VIN, pulse generator 100 also varies the pulse widths of the pulsed signals PL and PL1 in response to changes in the frequency of the trigger signal TRIG. The trigger signal TRIG has a nominal frequency that corresponds with an external condition.

In addition, the nominal frequency of the trigger signal TRIG changes in response to changes in the external condition. Pulse generator 100 varies the pulse widths of the pulsed signals PL and PL1 to change the external condition in a way that returns the frequency of the trigger signal TRIG to the nominal frequency.

In buck converter 140, the trigger signal TRIG has a nominal frequency that corresponds to a nominal output voltage VOUT on the output node NT. In addition, the nominal frequency of the trigger signal TRIG changes in response to changes in the output voltage VOUT on the output node NT. The output voltage VOUT on the output node NT can change due to changes in the power required by the load, as well as other factors such as changes in temperature. Pulse generator 100 varies the pulse widths of the pulsed signals PL and PL1 to change the output voltage VOUT on the output node NT in a way that returns the frequency of the trigger signal TRIG to the nominal frequency.

In operation, when the trigger signal TRIG goes high, the trigger signal TRIG sets SR flip-flop 120-1 which, in turn, outputs the rising edge of the pulsed signal PL. Thus, the rising edge of the trigger signal TRIG defines the rising edge of the pulsed signal PL. In addition, the rising edge of the trigger signal TRIG propagates through the number of delay cells DC that have been connected together within delay line 110, which outputs the rising edge of the delayed trigger signal DTRIG the delay time later.

The rising edge of the delayed trigger signal DTRIG resets SR flip-flop 120-1 which, in turn, outputs the falling edge of the pulsed signal PL. Thus, the rising edges of successive trigger signals TRIG define the period of the pulsed signal PL, while the rising edges of the trigger signal TRIG and delayed trigger signal DTRIG defines the pulse width.

The pulse width time, in turn, is defined by the total propagation times of the delay cells DC that have been connected together within delay line 110, in addition to the cell-to-cell propagation times. The propagation time through a delay cell DC, in turn, is a function of the magnitude of the phase shift current IPS that is input to the inverters 112 and the AND gate 114.

In the present example, each delay cell DC provides a nominal delay of 1 nS when the phase shift current IPS has the nominal magnitude. Thus, when 33 delay cells DC are serially connected together in response to the x-bit control word XWD and the magnitude of the phase shift current IPS is equal to the nominal magnitude, delay line 110 outputs the rising edge of the delayed trigger signal DTRIG approximately 33 nS after the rising edge of the trigger signal TRIG is received, thereby utilizing 33 delay cells DC to generate the pulsed signals PL and PL1 with a 33 nS pulse width.

However, if the phase shift current IPS is increased, delay line 110 can output the rising edge of the delayed trigger signal DTRIG in less time, such as 20 ns after the rising edge of the trigger signal TRIG, thereby utilizing 33 delay cells DC to generate the pulsed signals PL and PL1 with a 20 nS pulse width.

By contrast, if the phase shift current IPS is decreased, delay line 110 can output the rising edge of the delayed trigger signal DTRIG in more time, such as 66 ns after the rising edge of the trigger signal TRIG, thereby utilizing 33 delay cells DC to generate the pulsed signals PL and PL1 with a 66 nS pulse width.

Pulse drive circuit 120-2 drives the pulsed signal PL out as the pulsed signal PL1, and phase detector/charge pump 124 compares the rising edge of the reference clock signal CLK to the rising edge of the pulsed signal PL1 to detect a difference in phase, and changes the magnitude of the phase shift current IPS in response to the difference in phase. The magnitude of the phase shift current IPS is equal to the nominal magnitude when the reference clock signal CLK and the pulsed signal PL1 are in phase.

When the reference clock signal CLK leads the pulsed signal PL1, phase detector/charge pump 124 increases the phase shift current IPS to a magnitude that is defined by the difference in phase. The increased magnitude of the phase shift current IPS reduces the delay time through delay line 110 which, in turn, reduces the pulse widths of the pulsed signals PL and PL1. The pulse widths can be reduced to, for example, 20 ns by increasing the magnitude of the phase shift current IPS input to 33 serially-connected delay cells DC.

In buck converter 140, the reduced pulse widths reduce the power that is delivered to the load by driver MOS transistor M1, which increases the frequency of the trigger signal TRIG which, in turn, advances the rising edge of the trigger signal TRIG. The rising edge of the trigger signal TRIG, which controls the rising edges of the pulsed signals PL and PL1, advances the until the reference clock signal CLK and the pulsed signal PL1 are in phase, thereby returning the frequency of the trigger signal TRIG to the nominal frequency.

Similarly, when the reference clock signal CLK lags the pulsed signal PL1, phase detector/charge pump 124 decreases the phase shift current IPS to a magnitude that is defined by the difference in phase. The decreased magnitude of the phase shift current IPS increases the delay time through delay line 110 which, in turn, increases the pulse widths of the pulsed signals PL and PL1. The pulse widths can be increased to, for example, 66 ns by decreasing the magnitude of the phase shift current IPS that is input to 33 serially-connected delay cells DC.

In buck converter 140, the increased pulse widths increase the power that is delivered to the load by driver MOS transistor M1, which reduces the frequency of the trigger signal TRIG which, in turn, retards the rising edge of the trigger signal TRIG. The rising edge of the trigger signal TRIG, which controls the rising edges of the pulsed signals PL and PL1, is retarded until the reference clock signal CLK and the pulsed signal PL1 are in phase, thereby returning the frequency of the trigger signal TRIG to the nominal frequency.

Current-generation electronic devices frequently have one or more low-power modes where the electronic devices require less power to operate than when operating in a full power mode. In buck converter 140, when the load requires less power, the voltage on the output node NT drops at a slower rate because less power is consumed by the load.

When the voltage on the output node NT drops at a slower rate, the frequency of the trigger signal TRIG also drops. The reduced frequency of the trigger signal TRIG reduces the frequency of the pulsed signal PL1 which, in turn, causes the rising edge of the reference clock signal CLK to lead the rising edge of the pulsed signal PL1.

Phase detector/charge pump 124 detects the difference in phase and increases the phase shift current IPS to reduce the pulse widths of the pulsed signals PL and PL1. In buck converter 140, the reduced pulse widths reduce the power that is delivered to the load by the driver MOS transistor, which increases the frequency of the trigger signal TRIG which, in turn, advances the rising edge of the trigger signal TRIG. The rising edge of the trigger signal TRIG, which controls the rising edges of the pulsed signals PL and PL1, advances until the reference clock signal CLK and the pulsed signal PL1 are in phase, thereby returning the frequency of the trigger signal TRIG to the nominal frequency.

When an electronic device is turned off, the power required by the device drops to zero. In buck converter 140, when the load requires no power or very light power, the voltage on the output node NT drops at a very slow rate. In addition, synchronous MOS transistor M2 is turned on when the magnetic field around inductor L1 totally collapses after driver MOS transistor M1 has been turned off.

When the magnetic field around inductor L1 totally collapses, capacitor C1 begins to source current back through inductor L1 in the opposite direction through synchronous MOS transistor M2 to ground. The current flowing through synchronous MOS transistor M2 in the opposite direction is sensed by a current sense circuit 142, which outputs a sense signal SN in response. Pulse drive circuit 120-2 receives the sense signal SN and, in response, lowers the pulse signal PL2 to turn off synchronous MOS transistor M2, leaving a short dead time until drive MOS transistor M1 turns on again. When synchronous MOS transistor M2 turns off, the output voltage VOUT decays due to leakage currents when no power is required, and also due to the very light power consumption when very light power is required.

As the voltage on the output node NT drops at an even slower rate when no or very light power is required, the frequency of the trigger signal TRIG further drops. The reduced frequency of the trigger signal TRIG reduces the frequency of the pulsed signals PL and PL1 which, in turn, causes the rising edge of the reference clock signal CLK to lead the rising edge of the pulsed signal PL1.

Phase detector/charge pump 124 detects the difference in phase and increases the phase shift current IPS to reduce the pulse widths of the pulsed signals PL and PL1. However, the operational range of phase detector/charge pump 124 is limited (e.g., down to 20 ns from 33 ns, and up to 66 ns from 33 ns). When the limit is reached, the maximum magnitude of the phase shift current IPS is insufficient to bring the reference clock signal CLK and the pulsed signal PL1 back into phase alignment.

When the maximum magnitude of the phase shift current IPS is insufficient to bring the reference clock signal CLK and the pulsed signal PL1 back into phase alignment, phase detector/charge pump 124 outputs the limit signal LMT, returns the magnitude of the phase shift current IPS to the nominal magnitude, and then stops detecting the phase difference between the reference clock signal CLK and the pulsed signal PL1.

Trigger signal generator 108 receives the limit signal LMT, and switches from the integrating averaging feedback mode to the peak-to-peak monitoring mode. When in the peak-to-peak monitoring mode, regulation circuit 102 monitors the output voltage VOUT (trigger signal generator 108 monitors the comparison signal CP1), and generates a reset signal RST and switches from the peak-to-peak monitoring mode to the integrating averaging feedback mode when the output voltage VOUT falls below the regulation voltage (when the comparison signal CP1 indicates that the feedback voltage VFB has fallen below the reference voltage VRL).

Upon entering the integrating averaging feedback mode from the peak-to-peak monitoring mode, regulation circuit 102 generates a burst of trigger signals TRIG until the output voltage VOUT exceeds the overshoot voltage (trigger signal generator 108 generates a burst of trigger signals TRIG until the comparison signal CP2 indicates that the feedback voltage VFB has risen above the reference voltage VRH). In addition, when phase detector/charge pump 124 receives the reset signal RST, phase detector/charge pump 124 resumes detecting the phase difference between the reference clock signal CLK and the pulsed signal PL1.

In a no power or very light power condition, the burst of trigger signals TRIG generates a burst of pulsed signals PL and PL1, which turns drive MOS transistor M1 on and off a burst number of times to charge capacitor C1 connected to the output node NT of buck converter 140 to the overshoot voltage. The overshoot voltage is higher than the nominal output voltage.

The burst of trigger signals TRIG provides a Pulse-Frequency Mode (PFM) type of operation which saves power by allowing pulse generator 100 to be largely turned off during the time that it takes for the higher-than-nominal output voltage VOUT on the output node NT to decay down to the nominal output voltage where a trigger signal TRIG is again generated to recharge capacitor C1.

During the transition to/from the integrating averaging feedback mode and the pulse-to-pulse monitoring mode, the output voltage VOUT is maintained within a small tolerance band. Ideally, the tolerance band during the pulse-to-pulse monitoring mode is less than or equal to the tolerance band during the integrating averaging feedback mode.

One of the advantages of the present invention is that when a load transitions from no or very light power to full power, pulse generator 100 quickly responds to the increased need for power. Each time that the phase shift current IPS reaches the maximum magnitude, the output voltage VOUT is raised to the overshoot voltage and the phase shift current IPS is reset to the nominal magnitude. As a result, pulse generator 100 can quickly respond to the increased need for power.

Another advantage of pulse generator 100 is that pulse generator 100 directly responds to changes in the supply voltage that is input to buck converter 140, as well as responding to changes in the power delivered to a load, i.e., changes to the output voltage VOUT that result from variations in the power delivered to the load and other conditions such as changes in temperature.

A further advantage of the present invention is that the frequency of the trigger signal TRIG is substantially constant. The delay time through delay line 110 changes to bring the trigger signal TRIG and the reference clock signal CLK back into phase, which returns the frequency of the trigger signal TRIG to the nominal frequency. A more constant frequency of the trigger signal TRIG limits the electromagnetic interference (EMI) that is generated by pulse generator 100, making suppression of the interference simpler.

Another of the advantages of the present invention is that the pulsed signals PL and PL1 can be generated with any pulse width within a wide range of pulse widths, e.g., 20 ns to 66 ns with 33 delay cells having a 33 ns nominal value. As a result, a substantially infinite resolution can be obtained within this range without quantization errors.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:
1. A pulse generator comprising:
    a delay line to receive a trigger signal, generate a delayed trigger signal a delay time later in response to the trigger signal, and vary the delay time in response to changes in a magnitude of a phase shift current;

a pulse circuit that is connected to the delay line, the pulse circuit to generate a pulsed signal in response to the trigger signal and the delayed trigger signal;

an oscillator to generate a reference clock signal; and a phase detector/charge pump that is connected to the delay line, the pulse circuit, and the oscillator, the phase detector/charge pump to generate the phase shift current, detect a difference in phase between an edge of the reference clock signal and an edge of the pulsed signal, and vary the magnitude of the phase shift current in response to the difference in phase.

2. The pulse generator of claim 1 wherein the delay line receives an x-bit control word, and varies the delay time in response to changes in the x-bit control word.

3. The pulse generator of claim 2 and further comprising a threshold detect/digitizer circuit that is connected to the delay line, the threshold detect/digitizer circuit to change the x-bit word in response to changes in a magnitude of a current magnitude signal.

4. The pulse generator of claim 3 and further comprising a current sense circuit that is connected to the threshold detect/digitizer circuit, the current sense circuit to sense a magnitude of a timing current and output the current magnitude signal in response, the magnitude of the current magnitude signal represents the magnitude of the timing current.

5. The pulse generator of claim 4 and further comprising a voltage-to-current converter that is connected to the current sense circuit, the voltage-to-current converter to receive an input voltage, generate the timing current in response to the input voltage, and vary the magnitude of the timing current in response to changes in a magnitude of the input voltage.

6. The pulse generator of claim 5 and further comprising a regulation circuit that receives an output voltage, and generates the trigger signal in response to changes in the output voltage, the regulation circuit to switch from an integrating averaging feedback mode to a peak-to-peak monitoring mode when a limit signal generated by the phase detector/charge pump indicates that the phase shift current has a maximum magnitude.

7. The pulse generator of claim 6 wherein:
the phase detector/charge pump stops detecting a difference in phase between the reference clock signal and the pulsed signal when the phase shift current reaches the maximum magnitude;
the phase detector/charge pump stops resumes detecting a difference in phase between the reference clock signal and the pulsed signal in response to a reset signal; and
when in the peak-to-peak monitoring mode and the output voltage falls below a regulation voltage, the regulation circuit generates the reset signal and outputs a number of trigger signals until the output voltage exceeds an overshoot voltage.

8. The pulse generator of claim 7 wherein the delay line includes:
a plurality of delay cells;
a plurality of switches that are connected to the plurality of delay cells; and
a delay line controller that is connected to the plurality of switches, the delay line controller to close a number of switches in response to the x-bit control word, the x-bit control word to identify a number of delay cells from the plurality of delay cells, the switches to serially connect together the number of delay cells identified by the x-bit word.

9. The pulse generator of claim 8 wherein the pulsed signal has a square waveform with pulse widths that are defined by a difference between the delayed trigger signal and the trigger signal.

10. The pulse generator of claim 9 wherein the pulse circuit includes:
a SR flip-flop having a set input that receives the trigger signal, a reset input that receives the delayed trigger signal, and a Q output; and
a pulse drive circuit that is connected to the Q output of the SR flip-flop, the pulse drive circuit to drive a signal output from the Q output to form the pulsed signal.

11. A method of operating a pulse generator, the method comprising:
delaying a trigger signal by a delay time to form a delayed trigger signal, and varying the delay time in response to changes in a magnitude of a phase shift current;
generating a pulsed signal in response to the trigger signal and the delayed trigger signal;
generating a reference clock signal;
comparing an edge of the pulsed signal with an edge of the reference clock signal to determine a phase difference;
generating the phase shift current; and
varying the magnitude of the phase shift current in response to the phase difference.

12. The method of claim 11 and further comprising receiving an x-bit control word, and varying the delay time in response to changes in the x-bit control word.

13. The method of claim 12 and further comprising changing the x-bit word in response to changes in a magnitude of a current magnitude signal.

14. The method of claim 13 and further comprising sensing a magnitude of a timing current, and outputting the current magnitude signal in response, the magnitude of the current magnitude signal representing the magnitude of the timing current.

15. The method of claim 14 and further comprising receiving an input voltage, generating the timing current in response to the input voltage, and varying the magnitude of the timing current in response to changes in a magnitude of the input voltage.

16. The method of claim 15 and further comprising generating the trigger signal in response to changes in an output voltage, and switching from an integrating averaging feedback mode to a peak-to-peak monitoring mode when a limit signal generated by the phase detector/charge pump indicates that the phase shift current has a maximum magnitude.

17. The method of claim 16 and further comprising:
stopping a detection of a difference in phase between the reference clock signal and the pulsed signal when the phase shift current reaches the maximum magnitude;
resuming the detection of the difference in phase between the reference clock signal and the pulsed signal in response to a reset signal; and
when in the peak-to-peak monitoring mode and the output voltage falls below a regulation voltage, generating the reset signal and outputs a number of trigger signals until the output voltage exceeds an overshoot voltage.

18. The method of claim 17 wherein the trigger signal is delayed by a number of serially-connected delay cells to form the delayed trigger signal, the delay time changing in response to changes in the number of serially-connected delay cells, the x-bit control word identifying a number of delay cells to be serially connected together.

19. The method of claim 18 wherein the pulsed signal has a square waveform with pulse widths that are defined by a difference between the delayed trigger signal and the trigger signal.

20. The method of claim 19 wherein generating the pulsed signal includes:
- setting a SR flip-flop in response to the trigger signal, resetting the SR flip-flop in response to the delayed trigger signal, and outputting a Q output signal that has a logic state determined by a logic state of the trigger signal and a logic state of the delay trigger signal; and
- driving the Q output signal to form the pulsed signal.

\* \* \* \* \*